(12) United States Patent
Yamada (10) Patent No.: US 9,960,179 B2
(45) Date of Patent: May 1, 2018

(54) SEMICONDUCTOR MEMORY DEVICE AND METHOD FOR MANUFACTURING SAME

(71) Applicant: Toshiba Memory Corporation, Minato-ku (JP)

(72) Inventor: Kenta Yamada, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/463,582

(22) Filed: Mar. 20, 2017

(65) Prior Publication Data

US 2018/0083031 A1    Mar. 22, 2018

Related U.S. Application Data

(60) Provisional application No. 62/395,710, filed on Sep. 16, 2016.

(51) Int. Cl.

| | |
|---|---|
| *H01L 29/792* | (2006.01) |
| *H01L 27/11582* | (2017.01) |
| *H01L 27/1157* | (2017.01) |
| *H01L 23/522* | (2006.01) |
| *H01L 23/528* | (2006.01) |
| *H01L 23/532* | (2006.01) |
| *H01L 29/04* | (2006.01) |
| *H01L 29/16* | (2006.01) |
| *H01L 21/28* | (2006.01) |

(52) U.S. Cl.
CPC .. *H01L 27/11582* (2013.01); *H01L 21/28282* (2013.01); *H01L 23/528* (2013.01); *H01L 23/5226* (2013.01); *H01L 23/53295* (2013.01); *H01L 27/1157* (2013.01); *H01L 29/04* (2013.01); *H01L 29/16* (2013.01)

(58) Field of Classification Search
CPC ........... H01L 27/11582; H01L 27/1157; H01L 21/28282; H01L 23/5226; H01L 23/528; H01L 23/53295; H01L 29/04; H01L 29/16
USPC ........................................................ 257/324
See application file for complete search history.

(56) References Cited

U.S. PATENT DOCUMENTS

| | | | |
|---|---|---|---|
| 7,732,891 B2 | 6/2010 | Tanaka et al. | |
| 7,936,004 B2 | 5/2011 | Kito et al. | |
| 9,634,022 B2 * | 4/2017 | Lee | ..................... H01L 27/1157 |
| 9,761,601 B2 * | 9/2017 | Ishibashi | ............. H01L 27/1157 |

* cited by examiner

*Primary Examiner* — Tu-Tu Ho
(74) *Attorney, Agent, or Firm* — Oblon, McClelland, Maier & Neustadt, L.L.P.

(57) ABSTRACT

A semiconductor memory device includes a conductive layer; electrode layers stacked on the conductive layer; an insulating body extending through the electrode layers; and a semiconductor layer positioned between the insulating body and the electrode layers. The plurality of electrode layers include a first electrode layer, a second electrode layer provided between the conductive layer and the first electrode layer, and a third electrode layer provided between the conductive layer and the second electrode layer, and the semiconductor layer has a first layer thickness between the insulating body and the first electrode layer, a second layer thickness between the insulating body and the second electrode layer and a third layer thickness between the insulating body and the third electrode layer. The first layer thickness is thinner than the second layer thickness, and the second layer thickness is thinner than the third layer thickness.

15 Claims, 10 Drawing Sheets

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/395,710 filed on Sep. 16, 2016; the entire contents of which are incorporated herein by reference.

FIELD

Embodiments are generally related to a semiconductor memory device and a method for manufacturing the same.

BACKGROUND

A semiconductor memory device is under developing, which includes three-dimensionally disposed memory cells. For example, a NAND type flash memory device has a structure in which a semiconductor channel body extends through a plurality of word lines stacked on a source layer, and the memory cells are arranged in portions respectively where the channel body extends through the word lines. In such a structure, when the number of word lines stacked is increased in order to advance the integration degree of the memory cells, the channel body becomes longer, and the on-current is reduced which flows therethrough.

DETAILED DESCRIPTION

According to one embodiment, a semiconductor memory device includes a conductive layer; a plurality of electrode layers stacked on the conductive layer; an insulating body extending through the plurality of electrode layers; and a semiconductor layer positioned between the insulating body and the plurality of electrode layers, the semiconductor layer extending along the insulating body. The plurality of electrode layers include a first electrode layer, a second electrode layer provided between the conductive layer and the first electrode layer, and a third electrode layer provided between the conductive layer and the second electrode layer, and the semiconductor layer has a first layer thickness in a direction from the insulating body to the first electrode layer between the insulating body and the first electrode layer, a second layer thickness in a direction from the insulating body to the second electrode layer between the insulating body and the second electrode layer and a third layer thickness in a direction from the insulating body to the third electrode layer between the insulating body and the third electrode layer. The first layer thickness is thinner than the second layer thickness, and the second layer thickness is thinner than the third layer thickness.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
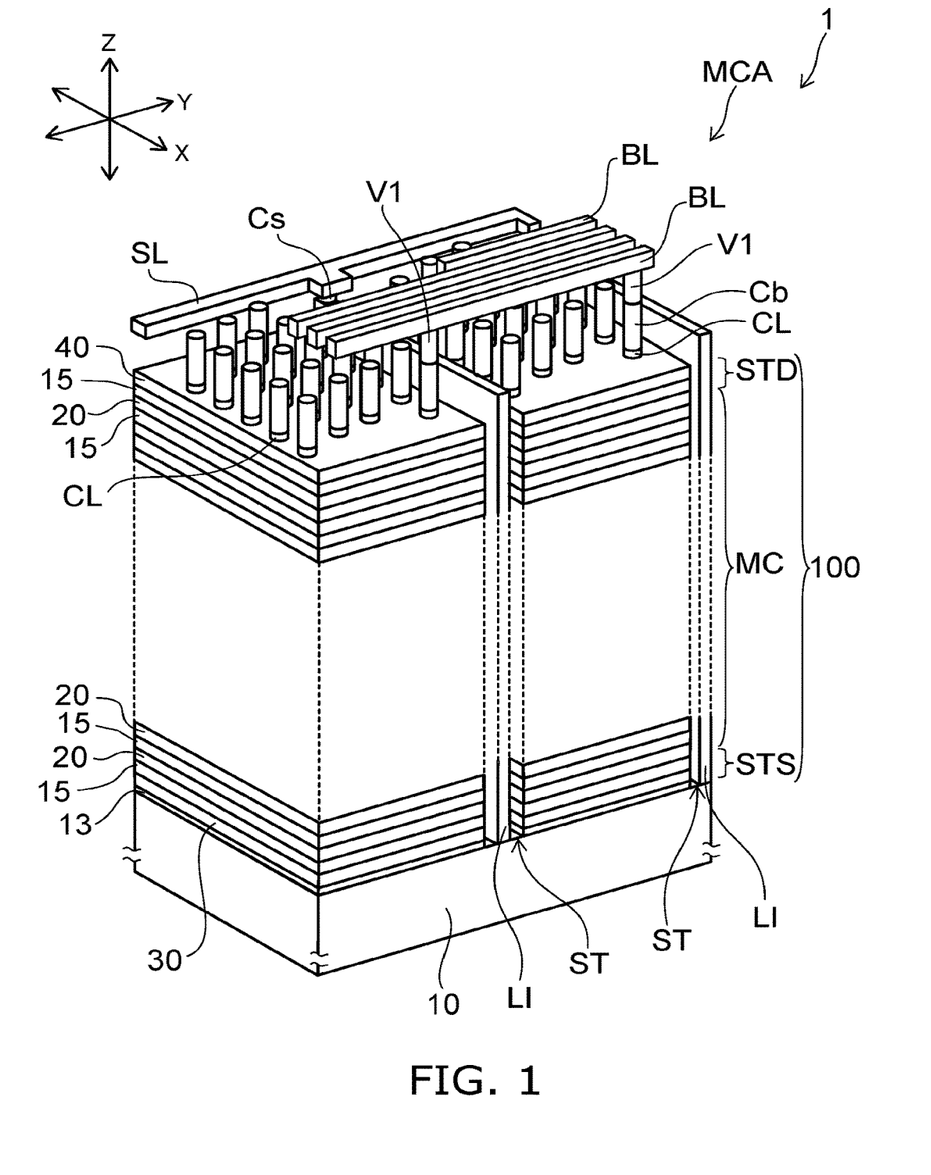
FIG. 1 is a perspective view schematically showing a semiconductor memory device according to a first embodiment.

FIG. 1 is a perspective view schematically showing a memory cell array MCA of a semiconductor memory device 1 according to a first embodiment. The semiconductor memory device 1 is, for example, a NAND type memory device and includes three-dimensionally disposed memory cells MC.

As shown in FIG. 1, the semiconductor memory device 1 includes, for example, a source layer 10 provided on a silicon substrate (not shown), and a stacked body 100. A plurality of stacked bodies 100 are arranged, for example, in the Y direction on the source layer 10. The adjacent stacked bodies 100 in the Y direction are separated by a slit space SL. The stacked body 100 includes a plurality of electrode layers (hereinafter, word lines 20, selection gates 30 and 40) stacked in the Z direction.

The selection gate 30 is provided on the source layer 10 with an insulating layer 13 interposed. The word lines 20 are stacked on the select gate 30. The interlayer insulating layers 15 are provided between the selection gate 30 and the lowermost word line 20 and between the adjacent word lines 20 in the Z direction. The selection gate 40 is provided on the uppermost word line 20 via another interlayer insulating layer 15.

The source layer 10 is, for example, a P-type well provided in a silicon substrate. The word lines 20, the select gates 30 and 40 are, for example, metal layers or low resistance polycrystalline silicon layers. The insulating layers 13 and 15 are, for example, silicon oxide layers.

The stacked body 100 includes, for example, a plurality of columnar bodies CL extending through the word lines 20 and the selection gate 40 and extending in the Z direction. The columnar bodies CL each include a semiconductor layer 50 (see FIG. 2). In addition, the stacked body 100 may include, for example, a semiconductor channel body (hereinafter referred to as a channel body 60) located between each of the columnar bodies CL and the source layer 10, and extending through the selection gate 30 in the Z direction.

The memory cell array MCA includes a plurality of stacked bodies 100 and includes a plurality of memory cells MC, selection transistors STS and STD disposed along the columnar bodies CL. The memory cells MC are provided at portions respectively where the columnar bodies CL intersect the word lines 20. A selection transistor STS is provided at a portion where the channel body 60 intersects the selection gate 30, and a selection transistor STD is provided at a portion where one of the columnar bodies CL intersects the selection gate 40.

The semiconductor memory device 1 further includes bit lines BL and a source line SL. The bit lines BL and the source line SL extend, for example, in the Y direction above the stacked bodies 100. A bit line BL is electrically connected to the semiconductor layer 50 in the columnar body CL via the contact plugs Cb and V1. The source line SL is electrically connected to the source layer 10 via the conductor body LI, for example. The conductor body LI is provided with a plate shape extending in the X direction and the Z direction in the slit space SL, for example, and is electrically connected to the source line SL via the contact plug Cs.

Figure 2:
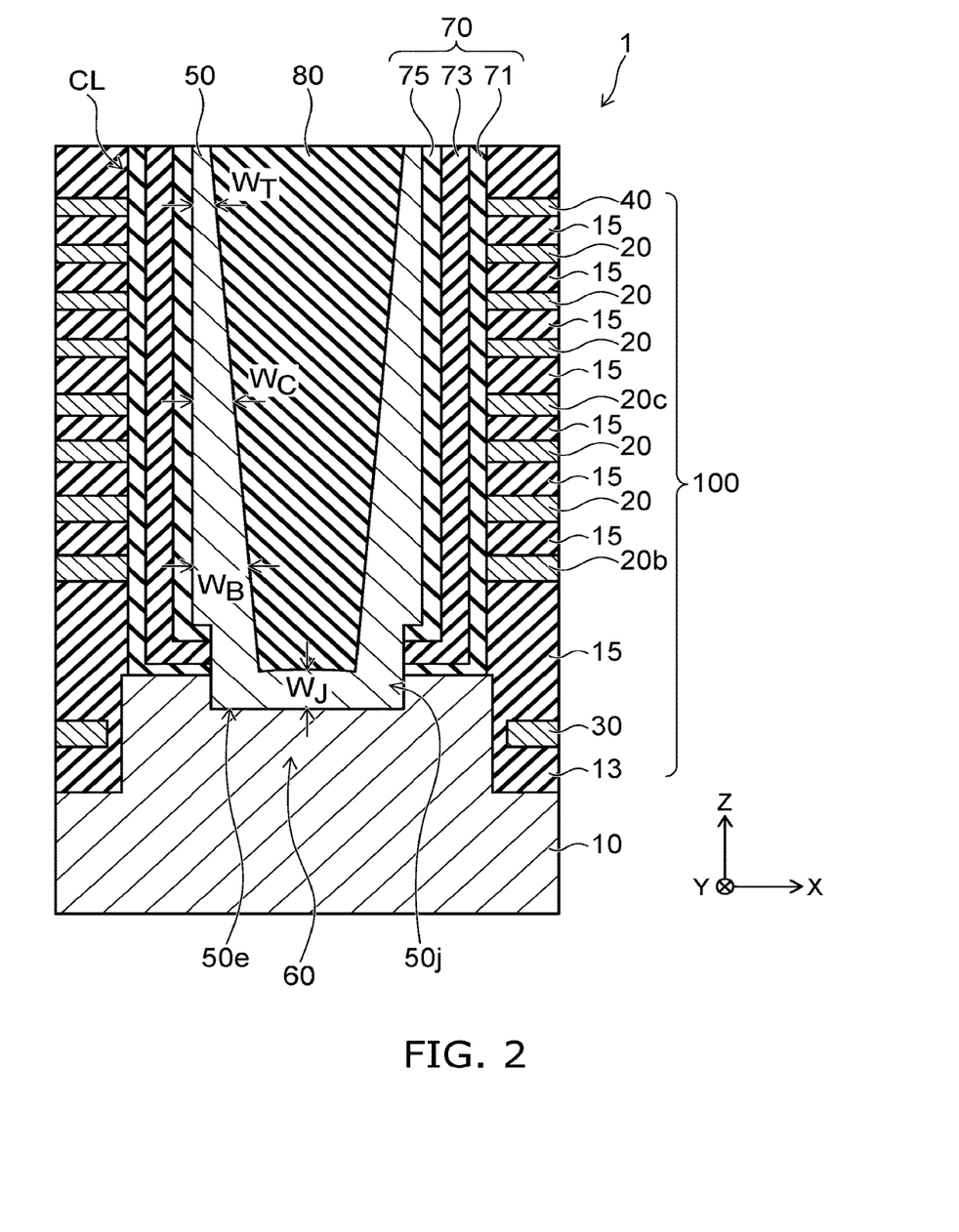
FIG. 2 is a schematic cross-sectional view showing the semiconductor memory device according to the first embodiment.

FIG. 2 is a schematic cross-sectional view showing the semiconductor memory device 1 according to the first embodiment. FIG. 2 shows a cross section of the stacked body 100.

As shown in FIG. 2, the stacked body 100 includes a columnar body CL and a channel body 60. The columnar body CL extends through the word lines 20 and the selection gate 40 in the Z direction. The channel body 60 extends through the selection gate 30 in the Z direction.

The columnar body CL includes, for example, a semiconductor layer 50, a memory layer 70 and an insulating core 80. The insulating core 80 is, for example, silicon oxide and extends in the Z direction in the columnar body CL. The semiconductor layer 50 surrounds the insulating core 80 and extends in the Z direction along the insulating core 80. The semiconductor layer 50 is, for example, a polycrystalline silicon layer. The memory layer 70 surrounds the semiconductor layer 50 and extends in the Z direction along the semiconductor layer 50.

The memory layer 70 has a structure in which the insulating layer 71, the charge storage layer 73, and the insulating layer 75 are stacked in the lateral direction (i.e. the X direction). The insulating layer 71 is, for example, a silicon oxide layer, and acts as a blocking insulator film. The charge storage layer 73 is, for example, a silicon nitride layer. The insulating layer 75 is, for example, a silicon oxide layer, and acts as a tunneling insulator film. In addition, the insulating layer 75 may have a structure in which silicon oxynitride (SiON) and silicon oxide are sequentially stacked from the charge storage layer 73 side.

The channel body 60 is, for example, a semiconductor containing silicon and is provided between the source layer 10 and the columnar body CL. The channel body 60 is electrically connected to the source layer 10. Further, the semiconductor layer 50 has a bottom end 50e positioned in the channel body 60, and is electrically connected to the channel body 60.

In the embodiment, the semiconductor layer 50 has a layer thickness that gradually decreases in the Z direction. For example, the semiconductor layer 50 has a layer thickness $W_T$ in a direction from the insulating core 80 to the selection gate 40 between the selection gate 40 and the insulating core 80. The semiconductor layer 50 has a layer thickness $W_B$ in a direction from the insulating core 80 to the lowermost word line 20b between the word line 20b and the insulating core 80. Moreover, the semiconductor layer 50 has a layer thickness $W_C$ in the direction from the insulating core 80 to an intermediate word line 20c between the word line 20c and the insulating core 80. The semiconductor layer 50 is provided so that the layer thickness $W_T$ is thinner than the layer thickness $W_C$, and the layer thickness $W_C$ is thinner than the layer thickness $W_B$. $W_T$ is, for example, about 6 nanometers, and $W_B$ is, for example, 12 to 16 nanometers.

Furthermore, the semiconductor layer 50 has a connecting portion 50j between the channel body 60 and the insulating core 80. The connecting portion 50j has a layer thickness $W_J$ in the direction from the insulating core 80 to the channel body 60 (i.e. the Z direction). Then, the semiconductor layer 50 is provided so that the layer thickness $W_J$ is thicker than the layer thickness $W_T$, for example.

A method of manufacturing the semiconductor memory device 1 will be described below with reference to FIGS. 3A to 3L. FIGS. 3A to 3L are schematic cross-sectional views showing a manufacturing process of the semiconductor memory device 1 according to the first embodiment.

Figure 3A:
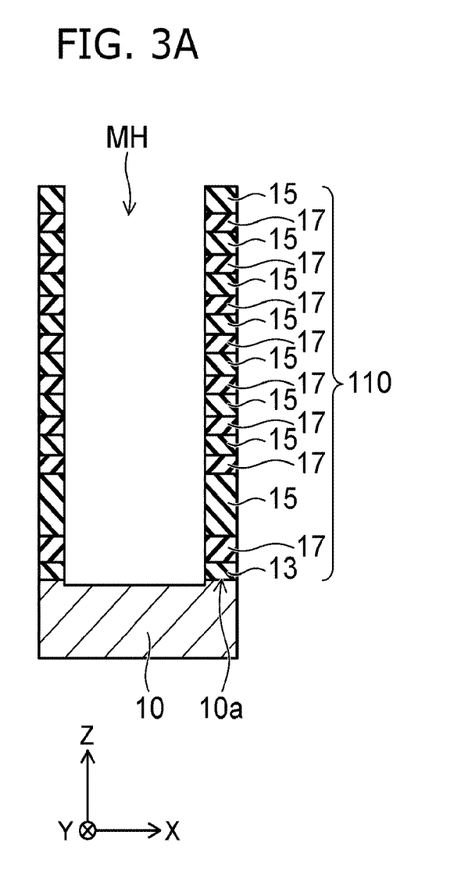
FIGS. 3A to 3L are schematic cross-sectional views showing a manufacturing process of the semiconductor memory device according to the first embodiment.

As shown in FIG. 3A, a stacked body 110 is formed on a source layer 10, and a memory hole MH is formed from the top surface thereof with a depth capable of reaching the source layer 10. The stacked body 110 includes an insulating layer 13, interlayer insulating layers 15, and sacrificial layers 17 stacked on the front surface 10a of the source layer 10. The interlayer insulating layers 15 and the sacrificial layers 17 are alternately stacked on the insulating layer 13. A bottom surface of the memory hole MH is positioned at a level below the front surface 10a of the source layer 10.

The insulating layer 13 and the interlayer insulating layers 15 are silicon oxide layers formed, for example, using PCVD (Plasma enhanced Chemical Vapor Deposition). The sacrificial layers 17 are, for example, silicon nitride layers formed using PCVD.

Figure 3B:
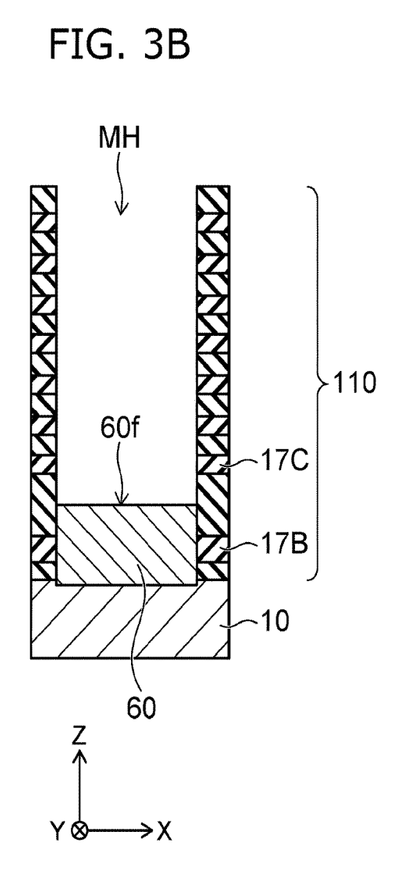

As shown in FIG. 3B, a channel body 60 is formed at a bottom portion of the memory hole MH. The channel body 60 is, for example, a semiconductor containing silicon which is epitaxially grown on the source layer 10. For example, the channel body 60 is formed such that a top surface 60f thereof is positioned at a level between the lowermost layer 17B of the sacrificial layers 17 and the sacrificial layer 17C adjacent thereto.

Figure 3C:
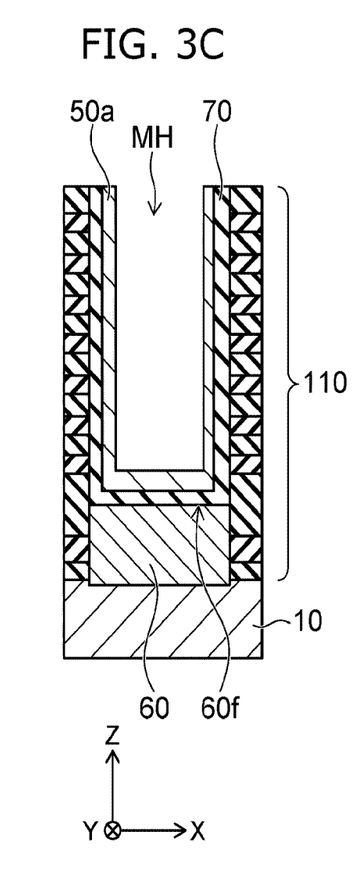

As shown in FIG. 3C, a memory layer 70 is formed so as to cover an inner surface of the memory hole MH and the top surface 60f of the channel body 60. The memory layer 70 has a stacked structure including an insulating layer 71, a charge storage layer 73 and an insulating layer 75 (see FIG. 2), which are sequentially stacked, for example, using ALD (Atomic Layer Deposition).

Further, a semiconductor layer 50a is formed so as to cover the inner surface of the memory hole MH. The semiconductor layer 50a is, for example, an amorphous silicon layer formed using CVD. The semiconductor layer 50a is formed on the memory layer 70.

Figure 3D:
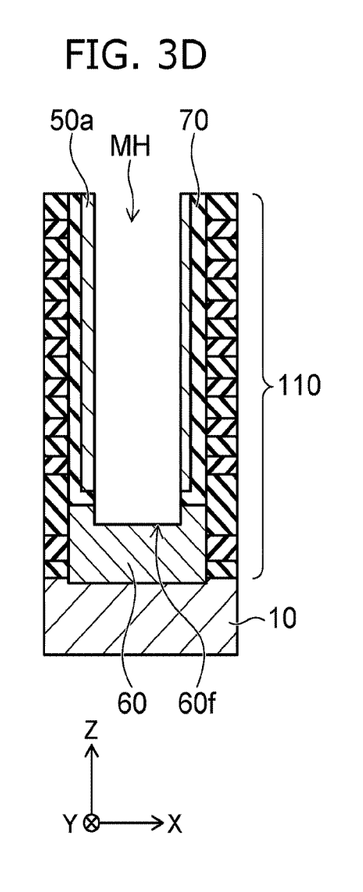

As shown in FIG. 3D, a part of the semiconductor layer 50a and a part of the memory layer 70 formed on the top surface 60f of the channel body 60 are selectively removed.

For example, by using anisotropic RIE (Reactive Ion Etching), the semiconductor layer 50a and the memory layer 70 are selectively etched while leaving parts formed on the inner wall of the memory hole MH. At this time, the semiconductor layer 50a protects the memory layer 70 formed on the inner wall of the memory hole MH.

Figure 3E:
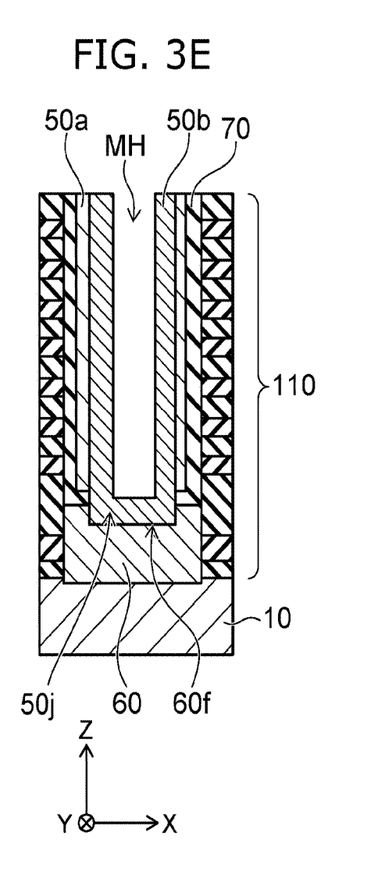

As shown in FIG. 3E, a semiconductor layer 50b is formed to cover the inner surface of the memory hole MH. The semiconductor layer 50b is, for example, an amorphous silicon layer formed using CVD, and covers the semiconductor layer 50a and the top surface 60f of the channel body 60.

Figure 3F:
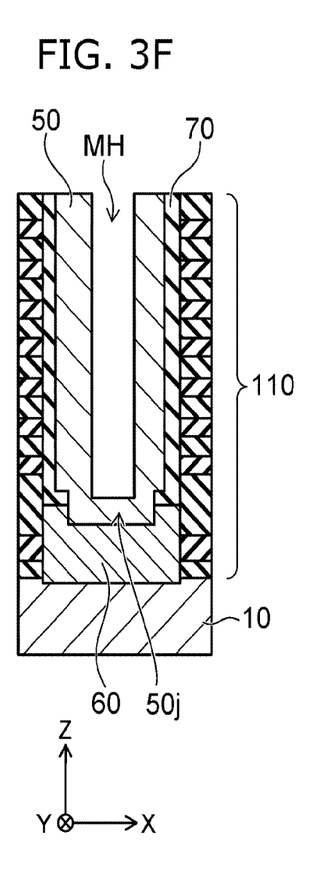

As shown in FIG. 3F, the semiconductor layers 50a and 50b formed on the inner surface of the memory hole MH are thermally treated to form the semiconductor layer 50. The semiconductor layer 50 is, for example, a polycrystalline silicon layer obtained by crystallizing the amorphous silicon layers.

Figure 3G:
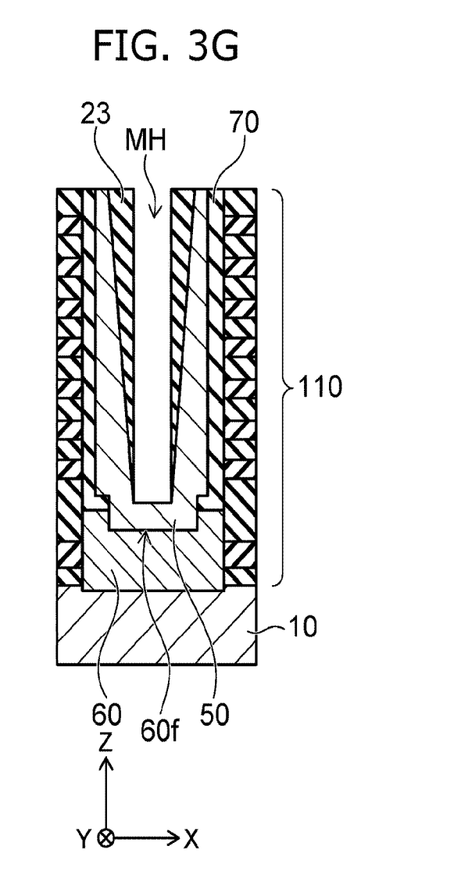

As shown in FIG. 3G, a part of the semiconductor layer 50 is oxidized to form an insulating layer 23. The insulating layer 23 is formed, for example, using an oxidation method, ISSG (In-situ Steam Generation). For example, by using the conditions under which an oxidation rate is limited by a supplied amount of oxidizing agent, the insulating layer 23 is formed to be thicker on an opening side of the memory hole MH than a thickness on the bottom of the memory hole MH. That is, the oxidation of the semiconductor layer 50 is performed under the conditions that suppress an oxidation in a part covering the top surface 60f of the channel body 60, and facilitate an oxidation in a part covering the inner wall of the memory hole MH.

Figure 3H:
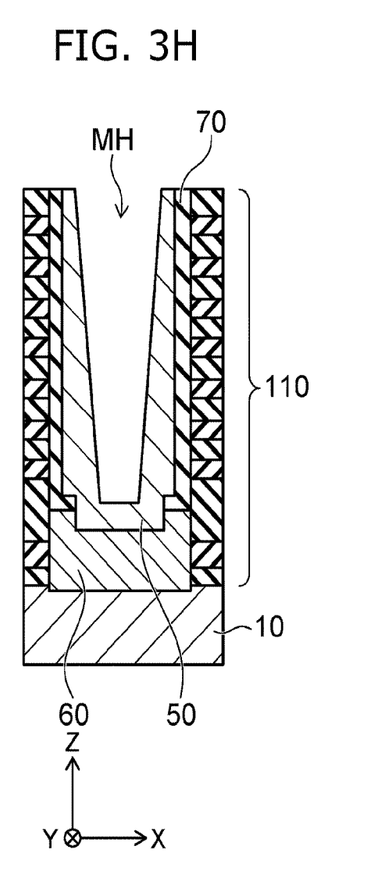

As shown in FIG. 3H, the insulating layer 23 is removed, for example, by wet etching. The semiconductor layer 50 is formed so that the layer thickness thereof (i.e. the thickness in the X direction) gradually decreases in a direction from the bottom surface to the opening in the memory hole MH. Then, the layer thickness of the part, which is formed on the channel body 60 at the bottom surface of the memory hole MH, is preferably maintained at the initially formed thickness.

Figure 3I:
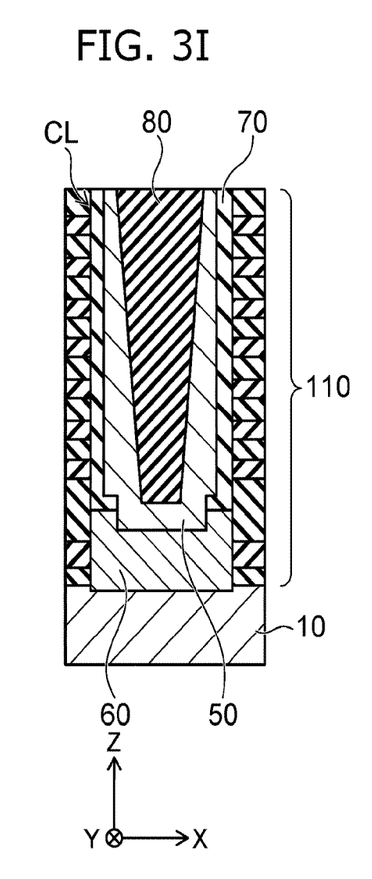

As shown in FIG. 3I, an insulating core 80 is formed so as to fill the inside of the memory hole MH to complete the columnar body CL. The insulating core 80 is formed, for example, by depositing silicon oxide using CVD to fill the inside of the memory hole MH. Alternatively, the insulating core 80 may be formed without removing the insulating layer 23 shown in FIG. 3G.

Figure 3J:
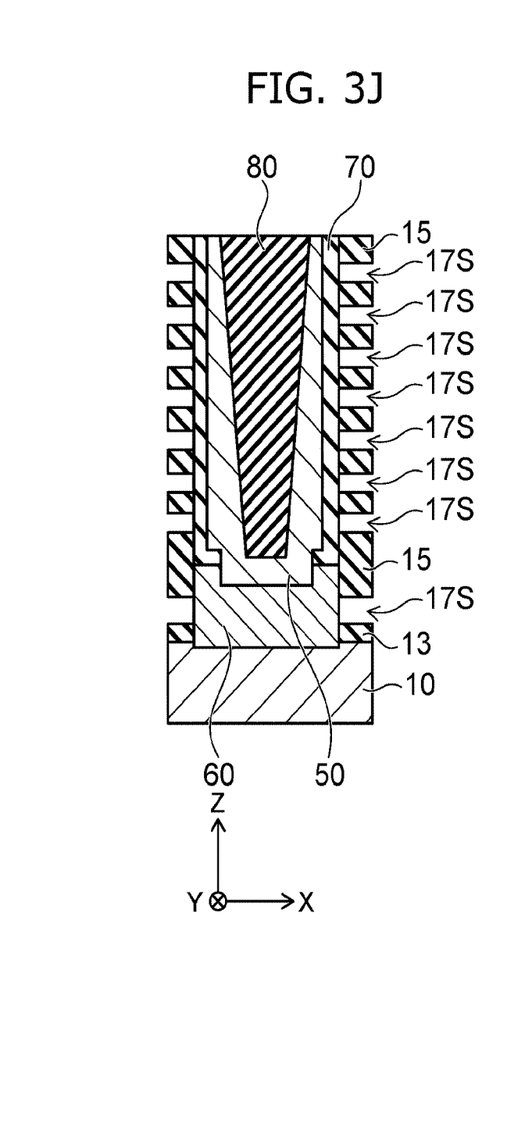

As shown in FIG. 3J, the sacrifice layers 17 are selectively removed. The sacrificial layers 17 can be etched, for example, by supplying hot phosphoric acid through the slit spaces ST (see FIG. 1). The lateral surface of the columnar body CL and the lateral surface of the channel body 60 are exposed in the spaces 17s after the removal of the sacrifice layers 17.

Figure 3K:
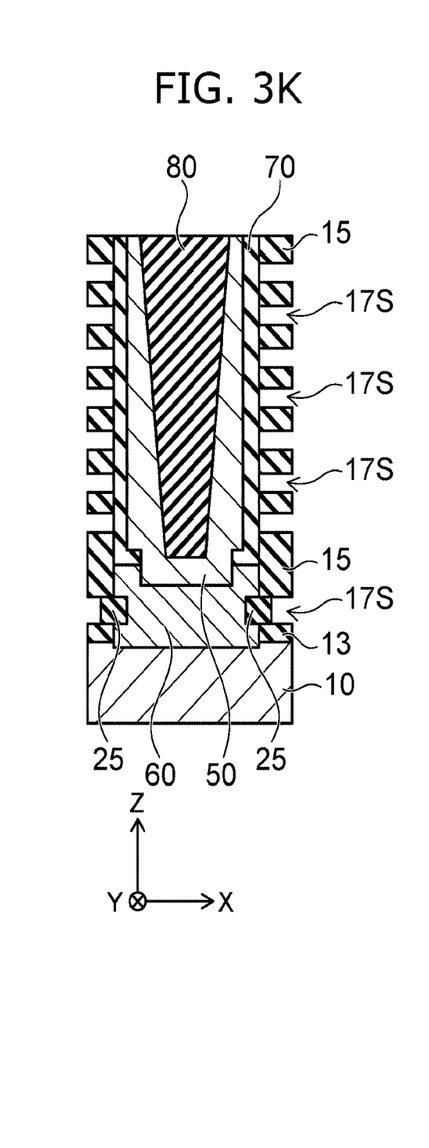

As shown in FIG. 3K, an insulating layer 25 is formed by thermally oxidizing the side surface of the channel body 60 exposed in the space 17s. The insulating layer 25 acts as a gate insulating layer in the source side selection transistor STS.

Figure 3L:
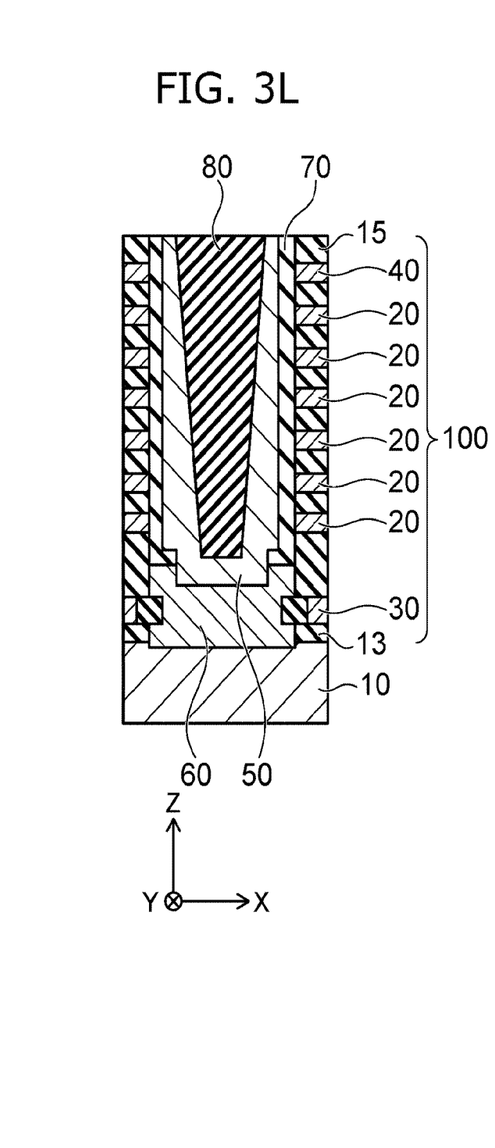

As shown in FIG. 3L, word lines 20, selection gates 30 and 40 are formed in the spaces 17s to complete the memory cell array MCA. The word lines 20, selection gates 30 and 40 are formed by depositing a metal layer, for example, using CVD. The source gases of CVD are supplied, for example, through the slit spaces ST (see FIG. 1).

In the embodiment, the semiconductor layer 50, which act as the channel body of the memory cell MC, is formed to be thicker than a predetermined thickness, and then, thinned by thermal oxidization. When a polycrystalline silicon layer is formed, for example, by crystallizing an amorphous silicon layer using thermal treatment, a size of crystal grains in the polycrystalline silicon layer may be enlarged as the layer thickness of the amorphous silicon layer is increased. Thereby, it is possible to increase the carrier mobility in the polycrystalline silicon and to increase the ON-current of memory cell MC. Further, it is also possible to improve the S-factor of memory cell transistor and to suppress the variation of threshold voltage.

However, as shown in FIG. 3E, the connection portion 50j formed on the channel body 60 has a layer thickness obtained by crystallizing the semiconductor layer 50b, and is formed to be thinner than a portion in which the semiconductor layer 50a and the semiconductor layer 50b stacked on the inner wall are crystallized. Thus, there may be a case where the connection portion 50j (see FIG. 2) becomes thinner, and a connection failure is caused between the semiconductor layer 50 and the channel body 60, when the layer thickness of the semiconductor layer 50 is wholly reduced. In the embodiment, while maintaining the layer thickness of the connection portion 50j, the semiconductor layer 50 formed on the inner wall of the memory hole MH is thinned by thermal oxidization of the semiconductor layer 50 under the conditions where the oxidization is facilitated in the portion formed on the inner wall of the memory hole MH, and is suppressed in the connection portion 50j. As a result, the semiconductor layer 50 is formed so that the layer thickness thereof gradually decreases in the direction from the bottom surface to the opening of the memory hole MH.

It should be noted that it is possible to increase the carrier mobility, for example, in the thinning process of the semiconductor layer 50 using the thermal oxidization comparing with an etching method such as RIE. This may be because of electrical inactivation of defects existing at the grain boundary of polycrystalline silicon due to the termination thereof with the oxidizing agent.

Figure 4:
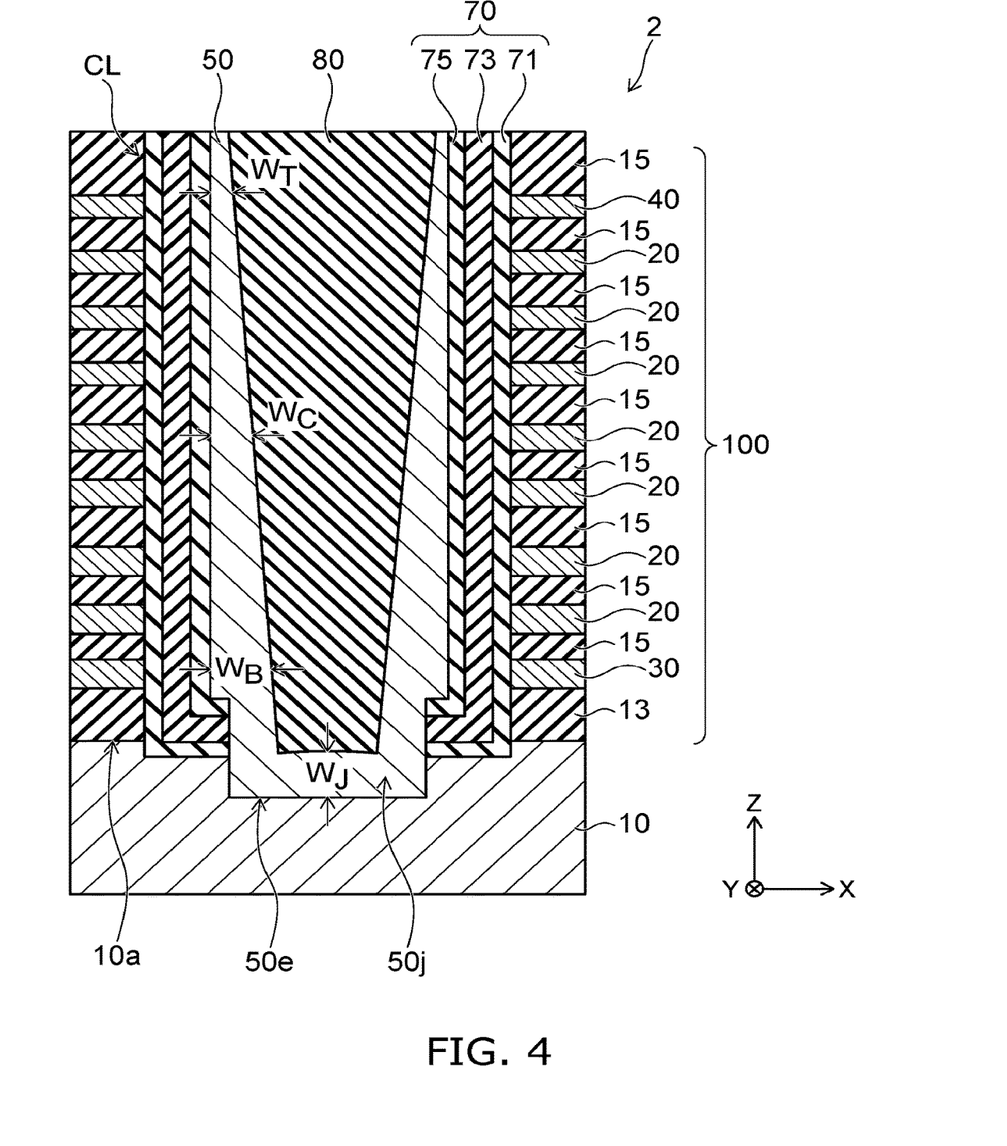
FIG. 4 is a schematic cross-sectional view showing a semiconductor memory device according to a variation of the first embodiment.

FIG. 4 is a schematic cross-sectional view showing a semiconductor memory device 2 according to a variation of the first embodiment. In the semiconductor memory device 2, the channel body 60 is not provided, and the columnar body CL is directly connected to the source layer 10.

As shown in FIG. 4, the columnar body CL extends in the Z direction through a selection gate 30, word lines 20, and a selection gate 40. The bottom end of the columnar body CL is connected to the source layer 10. A bottom end 50e of the semiconductor layer 50 is positioned at a level below the front surface 10a of the source layer 10. The semiconductor layer is electrically connected to the source layer 10 via a connection portion 50j.

Also in this example, a part of the semiconductor layer 50 formed on an inner wall of the memory hole MH is thinned, and the layer thickness (the thickness in the X direction) thereof becomes gradually thinner in the direction from the source layer 10 toward the select gate 40 (i.e. in the Z direction). The layer thickness $W_T$ between the selection gate 40 and the insulating core 80, the layer thickness $W_B$ between the selection gate 30 and the insulating core 80, and the layer thickness $W_C$ between the word line 20 and the insulating core 80 positioned in the middle has a relationship of $W_T<W_C<W_B$. Further, the layer thickness $W_3$ of the connecting portion 50j is kept at a thickness that makes it possible to prevent connection failure between the source layer 10 and the semiconductor layer 50.

Second Embodiment

Figure 5:
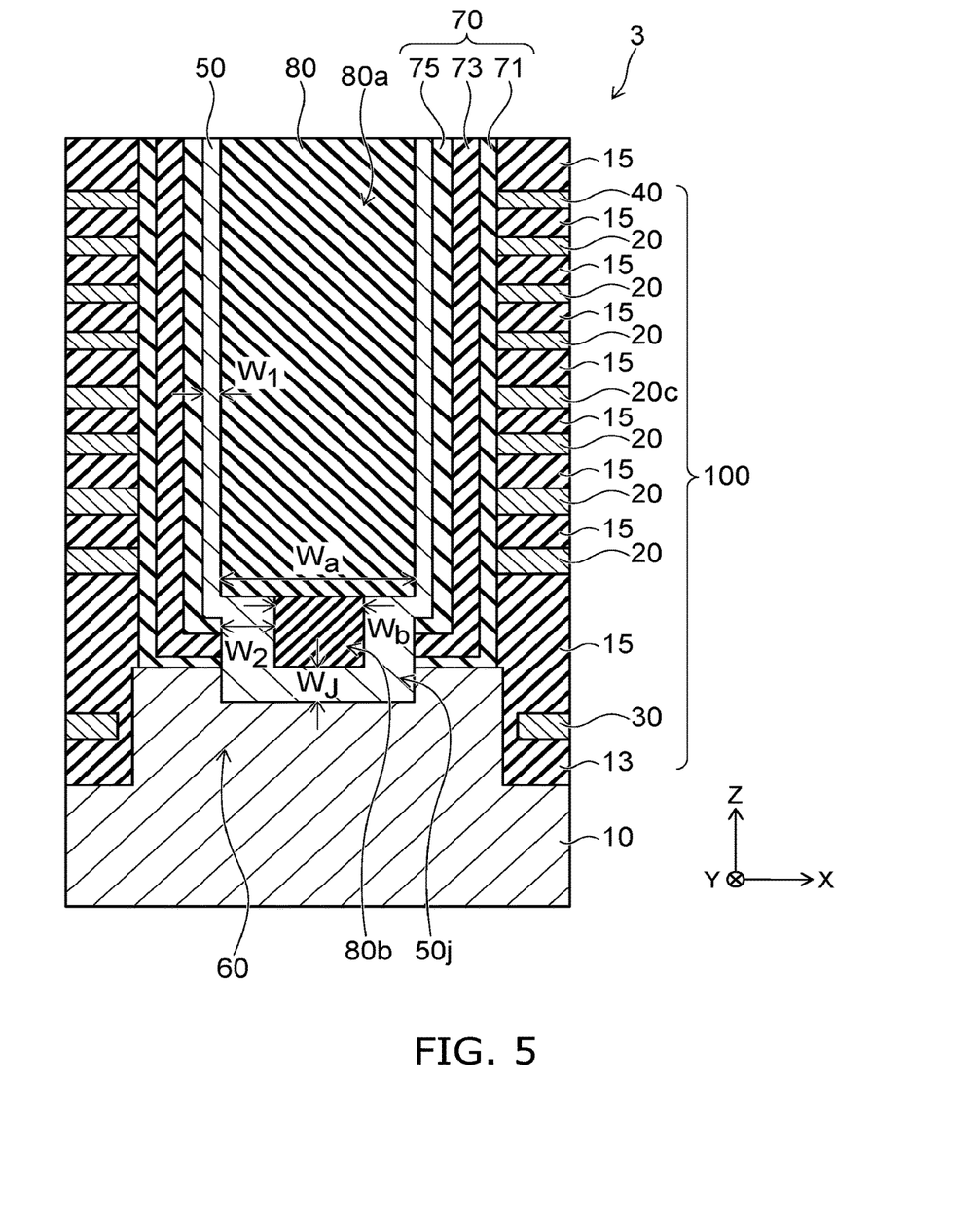
FIG. 5 is a schematic cross-sectional view showing a semiconductor memory device according to a second embodiment.

FIG. 5 is a schematic cross-sectional view showing a semiconductor memory device 3 according to a second embodiment. The semiconductor memory device 3 includes a channel body 60 between the source layer 10 and the columnar body CL. The columnar body CL extends in the Z direction through the word line 20 and the selection gate 40. The channel body 60 is provided so as to extend through the selection gate 30.

As shown in FIG. 5, the columnar body CL includes an insulating core 80 having a first portion 80a and a second portion 80b. The second portion 80b is located between the channel body 60 and the first portion 80a. A bottom surface of the first portion 80a has a width Wa in the X direction and the top surface of the second portion 80b has a width Wb in the X direction. The first portion 80a is provided so that Wa is wider than Wb.

The columnar body CL further includes a semiconductor layer 50 and a memory layer 70. The memory layer 70 has a structure in which an insulating layer 71, a charge storage layer 73, and an insulating layer 75 are stacked, and the insulating layer 75 is provided between the semiconductor layer 50 and the charge storage layer 73.

In the embodiment, the semiconductor layer 50 has a layer thickness $W_1$ in the X direction between the word line 20 and the insulating core 80 and between the selection gate 40 and the insulating core 80, and has a layer thickness $W_2$ in the X direction between the insulating layer 75 and the second portion 80b of the insulating core 80. The semiconductor layer 50 is provided so that $W_1$ is thinner than $W_2$. The connection portion 50j of the semiconductor layer 50 has a layer thickness $W_J$ in a direction from the second portion 80b toward the channel body 60 (i.e. Z direction), and is provided, for example, so that $W_1$ is thinner than $W_2$.

Figure 6A:
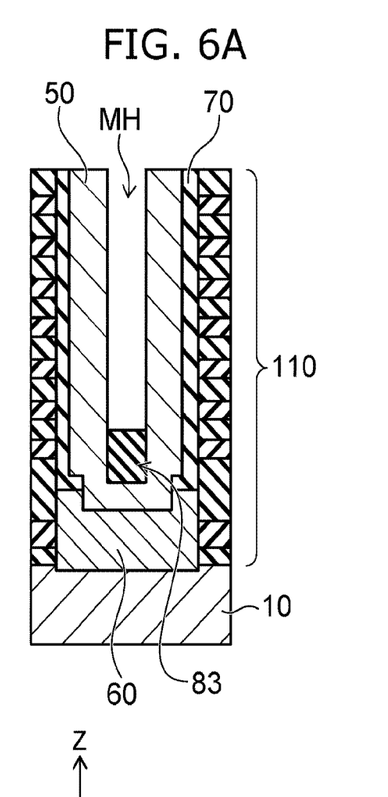
FIGS. 6A to 6C are schematic cross-sectional views showing a manufacturing process of the semiconductor memory device according to the second embodiment.
Figure 6B:
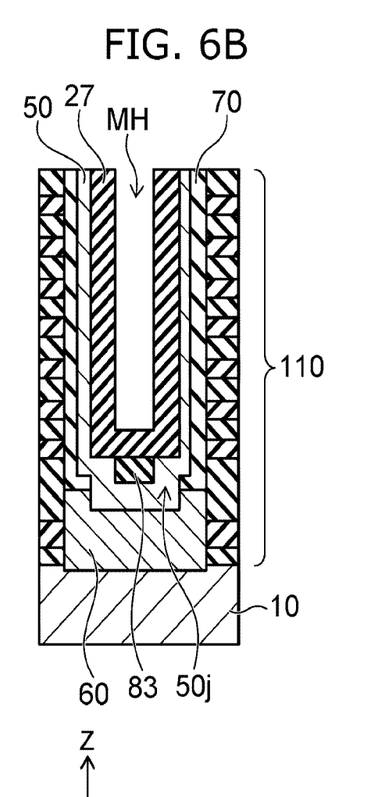
Figure 6C:
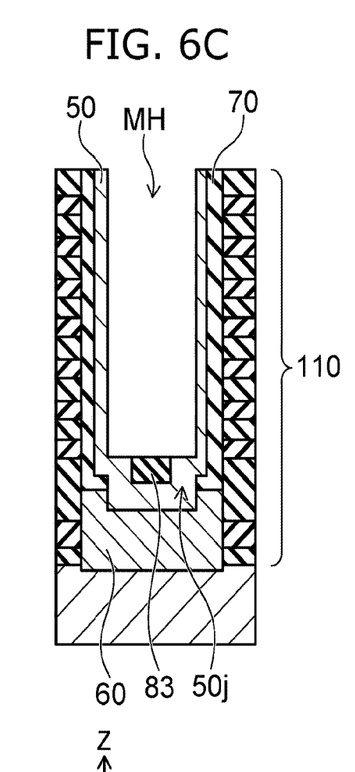

FIGS. 6A to 6C are schematic cross-sectional views showing a manufacturing process of the semiconductor memory device 3 according to the second embodiment. For example, FIG. 6A shows a step following FIG. 3F, and the steps after FIG. 3I are carried out following a step shown in FIG. 6C.

As shown in FIG. 6A, an insulating body 83 is embedded in the bottom of the memory hole MH after the formation of the semiconductor layer 50. The insulator 83 can be formed, for example, by etching back the silicon nitride layer deposited using CVD so as to fill the inside of the memory hole MH. The insulating body 83 is not limited to silicon nitride, but may be silicon oxide, for example.

As shown in FIG. 6B, a part of the semiconductor layer 50 is thermally oxidized to form an insulating layer 27 on the inner surface of the memory hole MH. The insulating body 83 has a thickness capable of being oxidized such that a bottom part thereof remains. Thus, it is possible to prevent the connection portion 50j of the semiconductor layer 50 from the oxidation.

As shown in FIG. 6C, the insulating layer 27 is removed, for example, using wet etching. As a result, the semiconductor layer 50 formed on the inner wall of the memory hole MH is thinned, and the connection portion 50j can maintain the layer thickness thereof.

Subsequently, as shown in FIG. 3I, the inside of the memory hole MH is filled with an insulating body to form an insulating core 80. The insulator 83 shown in FIG. 6C becomes the second portion 80b of the insulating core 80. For example, when silicon oxide is used for the insulating body 83, the insulating body is removed together with the insulating layer 27. However, the insulating layer that is newly embedded in the memory hole MH forms the first portion 80a and the second portion 80b. Alternatively, the insulating core 80 may be formed by embedding an insulating body in the memory hole MH without removing the insulating layer 27.

Figure 7:
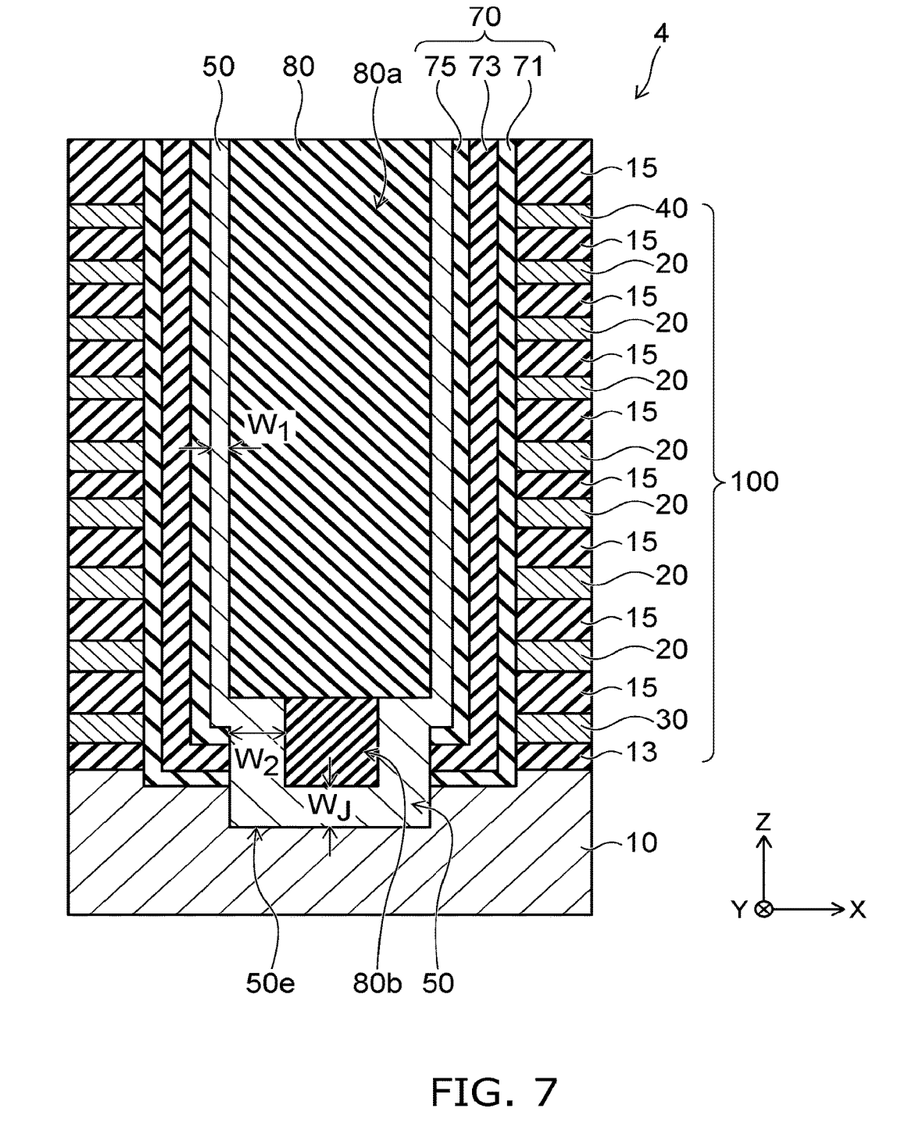
FIG. 7 is a schematic cross-sectional view showing a semiconductor memory device according to a variation of the second embodiment.

FIG. 7 is a schematic cross-sectional view showing a semiconductor memory device 4 according to a variation of the second embodiment. In the semiconductor memory device 4, the channel body 60 is not provided, and the columnar body CL is directly connected to the source layer 10.

As shown in FIG. 7, the columnar body CL extends in the Z direction through the selection gate 30, the word line 20, and the selection gate 40. The columnar body CL includes an insulating core 80 having a first portion 80a and a second portion 80b. For example, the first portion 80a is provided so as to extend in the Z direction through the word line 20 and the select gate 40. The second portion 80b is provided so as to extend through the selection gate 30, for example.

Also in this example, the semiconductor layer 50 has a layer thickness $W_1$ in the X direction between the word line 20 and the first portion 80a and between the selection gate 40 and the first portion 80a, and has a layer thickness $W_2$ in the X direction between the insulating layer 75 and the second portion 80b. Then, the semiconductor layer 50 is provided so that $W_1$ is thinner than $W_2$. The connecting portion 50j of the semiconductor layer 50 has a layer thickness $W_J$ in the Z direction, and is provided so that $W_1$ is thinner than $W_J$, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a conductive layer;
   a plurality of electrode layers stacked on the conductive layer;
   an insulating body extending through the plurality of electrode layers; and
   a semiconductor layer positioned between the insulating body and the plurality of electrode layers, the semiconductor layer extending along the insulating body, the plurality of electrode layers including a first electrode layer, a second electrode layer provided between the conductive layer and the first electrode layer, and a third electrode layer provided between the conductive layer and the second electrode layer, and
   the semiconductor layer having a first layer thickness in a direction from the insulating body to the first electrode layer between the insulating body and the first electrode layer, a second layer thickness in a direction from the insulating body to the second electrode layer between the insulating body and the second electrode layer and a third layer thickness in a direction from the insulating body to the third electrode layer between the insulating body and the third electrode layer,
   the first layer thickness being thinner than the second layer thickness, and
   the second layer thickness being thinner than the third layer thickness.

2. The semiconductor memory device according to claim 1, wherein the semiconductor layer is a polycrystalline silicon layer.

3. The semiconductor memory device according to claim 1, wherein the third electrode layer is a lowermost layer of the plurality of electrode layers.

4. The semiconductor memory device according to claim 1, wherein the first electrode layer is an uppermost layer of the plurality of electrode layers.

5. The semiconductor memory device according to claim 4, further comprising:
- a semiconductor channel body provided between the conductive layer and the insulating body, and extending through a fourth electrode layer positioned between the conductive layer and the third electrode layer,
- the semiconductor layer including a connecting portion positioned between the insulating body and the semiconductor channel body, and
- a layer thickness, in a direction from the insulating body to the semiconductor channel body, of the connecting portion is thicker than the first layer thickness.

6. The semiconductor memory device according to claim 4, wherein
- the semiconductor layer includes a connecting portion positioned between the conductive layer and the insulating body, and
- a layer thickness, in a direction from the insulating body to the conductive layer, of the connecting portion is thicker than the first layer thickness.

7. The semiconductor memory device according to claim 1, wherein the semiconductor layer has a layer thickness gradually decreasing in a direction from the third electrode layer to the first electrode layer.

8. The semiconductor memory device according to claim 1, further comprising:
- memory cells including charge storage portions positioned between the semiconductor layer and the plurality of electrode layers.

9. The semiconductor memory device according to claim 1, wherein the conductive layer is a source layer provided on a substrate.

10. A semiconductor memory device comprising:
- a conductive layer;
- a plurality of electrode layers stacked on a front surface of the conductive layer;
- an insulating body extending through the plurality of electrode layers;
- a semiconductor layer positioned between the insulating body and the plurality of electrode layers, the semiconductor layer extending along the insulating body; and
- an insulating layer positioned between the semiconductor layer and the plurality of electrode layers, the insulating layer extending along the semiconductor layer,
- the insulating body including a first portion extending through the plurality of electrode layers and a second portion positioned between the conductive layer and the first portion, the second portion having a width along the front surface of the conductive layer narrower than a width of the first portion in a same direction, and
- the semiconductor layer having a first layer thickness in a direction from the first portion to one of the plurality of electrode layers between the first portion and the one of the plurality of electrode layers, and a second layer thickness in a direction from the second portion to the insulating layer between the second portion and the insulating layer, the first layer thickness being thinner than the second layer thickness.

11. The semiconductor memory device according to claim 10, further comprising:
- another electrode layer positioned between the conductive layer and the plurality of electrode layers; and
- a semiconductor channel body provided between the conductive layer and the insulating body and extending through the another electrode layer,
- the semiconductor layer including a connecting portion located between the insulating body and the semiconductor channel body, and
- a layer thickness of the connecting portion in a direction from the insulating body to the semiconductor channel body is thicker than the first layer thickness.

12. The semiconductor memory device according to claim 10, wherein
- the semiconductor layer includes a connection portion positioned between the conductive layer and the insulating body, and
- a layer thickness of the connecting portion in a direction from the insulating body to the conductive layer is thicker than the first layer thickness.

13. The semiconductor memory device according to claim 10, further comprising:
- another electrode layer positioned between the conductive layer and the plurality of electrode layers,
- the second portion extending through the another electrode layer.

14. The semiconductor memory device according to claim 10, wherein the insulating body includes silicon oxide.

15. The semiconductor memory device according to claim 10, wherein the first portion includes silicon oxide, and the second portion includes silicon nitride.

* * * * *